United States Patent
Ekstrom et al.

(10) Patent No.: US 6,914,025 B2
(45) Date of Patent: Jul. 5, 2005

(54) HEAT CONDUCTIVE MATERIAL

(75) Inventors: Thommy Ekstrom, Stockholm (SE); Jie Zheng, Solna (SE); Kauthar Kloub, Sollentuna (SE); Sergey K. Gordeev, St. Petersburg (RU); Liya V. Danchukova, St. Petersburg (RU)

(73) Assignee: Skeleton Technologies AG, Baar (CH)

( * ) Notice: Subject to any disclaimer, the term of this patent is extended or adjusted under 35 U.S.C. 154(b) by 57 days.

(21) Appl. No.: 10/432,165

(22) PCT Filed: Sep. 10, 2001

(86) PCT No.: PCT/EP01/10439

§ 371 (c)(1), (2), (4) Date: Sep. 22, 2003

(87) PCT Pub. No.: WO02/42240

PCT Pub. Date: May 30, 2002

(65) Prior Publication Data

US 2004/0053039 A1 Mar. 18, 2004

(30) Foreign Application Priority Data

Nov. 21, 2000 (RU) ........................................ 2000129403

(51) Int. Cl.$^7$ ........................ C04B 35/577; H01L 23/373
(52) U.S. Cl. ........................ 501/90; 428/323; 428/325; 428/457; 428/698
(58) Field of Search ........................... 501/90; 428/323, 428/325, 457, 698

(56) References Cited

U.S. PATENT DOCUMENTS

| | | | |
|---|---|---|---|
| 4,242,106 A | 12/1980 | Morelock | |
| 4,381,271 A | 4/1983 | Hayden | |
| 5,106,393 A | 4/1992 | Ringwood | |
| 6,171,691 B1 | 1/2001 | Nishibayashi | |
| 6,270,848 B1 | 8/2001 | Nishibayashi | |
| 6,447,852 B1 * | 9/2002 | Gordeev et al. | 427/577 |

FOREIGN PATENT DOCUMENTS

| | | |
|---|---|---|
| EP | 0 043 541 | 1/1982 |
| EP | 0 859 408 B1 | 8/1998 |
| WO | WO 99/12866 | 3/1999 |

* cited by examiner

Primary Examiner—Karl Group
(74) Attorney, Agent, or Firm—Young & Thompson

(57) ABSTRACT

This invention relates to diamond-containing composite materials that have high thermal conductivity and thermal diffusivity, and to the use of such materials in heat sinks, heat spreading and other heat conductive applications. The material comprises diamond particles silicone carbide and silicon and has a thermal conductivity of at least 400 W/mK and a thermal diffusivity of at least 2.1 cm$^2$/s.

7 Claims, 2 Drawing Sheets

A photo taken in a SEM of a cross section of the material.

A photo taken in a SEM of a cross section of the material.

A photo taken in a SEM of a cross section of the material.

HEAT CONDUCTIVE MATERIAL

FIELD OF INVENTION

The present invention relates to a heat conductive composite material made from a mixture of diamond particles and comprising diamond particles, silicone carbide and silicon or silicon alloy.

BACKGROUND OF THE INVENTION

Materials having a high thermal conductivity are widely used in heat exchanging devices, such as heat sinks and heat exchangers etc, and are typically comprised of metals with high thermal conductivity, such as aluminum, copper and silver, the thermal conductivity of these metals being 120 to 220 W/mK, 400 W/mK and 430 W/mK, respectively. Silver is rather expensive and not used in the same extent as copper. The use of copper has some drawbacks. One is the rather high density (8.9 g/cm$^3$) that makes devices using copper heavy. The high density of copper also results in a quite low value of the thermal diffusivity $\alpha=1.2$ cm$^2$/s ($\alpha=\lambda/C_p*\rho$ where $\alpha$ is the thermal diffusivity factor, $\lambda$ is the thermal conductivity factor, $C_p$ the thermal capacity and $\rho$ the density). The low thermal diffusivity restricts the application of copper to articles where fast heat transfer is not needed. Another drawback is copper's tendency to oxidize. Copper oxide formed on the surface of a heat-exchanging device significantly reduces the thermal properties of the whole device. Yet another drawback is that copper has a high thermal expansion coefficient relative to material used in integrated circuits, the difference in thermal expansion coefficient causes tensions and a risk of cracks at the joint between the circuit and the heat sink if copper is used as heat sink material. The drawbacks of aluminum are a moderate thermal conductivity and a high thermal expansion coefficient.

In the electronic industry a need for better heat sinks have arisen due to the development of faster and smaller circuits. The heat producing elements can now be more closely packed. Consequently, the heat transfer has to be more efficient, the excess heat from local hotspots needs to be conducted away quickly The primarily requirements for heat sink material are high thermal conductivity, a thermal expansion coefficient close to that of Si and low specific gravity (see MRS Bulletin, volume 26 No 6,June 2001). Here diamond would have presented itself as the obvious material of choice for heat sinks.

Diamond is known to have good thermal conductivity properties (500 to 2000 W/mK) and would have been the perfect material for heat sinks would it not be for the cost and the difficulty of manufacturing suitable shapes. Still many heat sinks make use of diamond. There are different ways of applying diamond: as single diamond crystals, CVD diamond coatings and diamond composites.

U.S. Pat. No. 6,031,285 (Sumitomo) discloses a heat sink for semiconductors that has a structure which comprises a metal (A) of at least one metal selected from the group consisting of Cu, Ag, Au, Al, Mg, and Zn; a carbide (B') made from a metal (B) of at least one metal selected from the group consisting of the groups 4a and 5a of the Periodic Table and chromium; and a plurality of diamond particles. The heat sink has a structure wherein more than a quarter of the surface of the individual diamond particles is covered with the metal carbide (B') and the diamond particles covered with the metal carbide (B') are separated from one another by the metal (A). The heat transport goes from the diamond to the metal (A). The thermal conductivity properties ranges from 230 to 730 W/mK, the lowest values is achieved when the metal A consist of Ag, Cu and Mg and the highest when the metal A consist of mostly Ag and a small amount of Cu. Shortcomings of the invention are: low thermal conductivity properties when using Al, Mg, and Zn, and cost when using Ag and Au.

U.S. Pat. No. 6,171,691 (Sumitomo) discloses a material where diamond particles are surrounded by metal carbide, the metal carbide and diamonds form a skeleton, the interstices in this skeleton are filled with metal. First a metal alloy containing a small amount of carbide former is infiltrated between the diamonds that are placed in a mould. The carbide-former reacts with the diamonds and forms carbide on the surface of the diamonds. The carbide together with the diamond forms a connected structure. The "carrier" metal alloy is either solidified between the carbide-covered diamonds or evaporated. Then a second metal alloy is infiltrated into the free space of the porous body. Then the body is taken out of the mould. The metal is at least one of Ag, Cu, Au and Al and the carbide-former is at least one of Ti Zr and Hf. The heat transport goes from the diamond through the carbide to the metal. The thermal conductivity property ranges from 300 to 900 W/mK Shortcomings of this material are complicated processing and high cost of the product.

Both U.S. Pat. No. 6,031,285 and U.S. Pat. No. 6,171,691 teach away from using the carbide former as the only filling element, the reason being the carbide forming element in itself has a low thermal conductivity, which would lower the thermal conductivity of the invented material as a whole.

U.S. Pat. No. 5,783,316 (University of California Oakland) discloses a diamond-copper-silver composite. The material consists of diamond particles bound together with copper or copper alloys. The thermal conductivity of this material lies between that of the diamond particles and that of copper. In order to get a better adhesion of the copper alloys to the diamond particles, the latter are covered with a thin layer of carbide-forming metals. Drawbacks of this material are the rather high density caused by copper and the high thermal linear expansion coefficient, which is also determined by copper. The high thermal expansion results in a substantial deformation of the article at elevated temperatures. Also the material, like pure copper itself, is not resistant aghast oxidation.

There exists a number of patents disclosing diamond composites where the intended use is not primarily heat exchange. The main fields of application for these types of material are cutting and abrasive wear components. Several patents reveal techniques to produce materials containing diamond, silicon carbide and silicon using high-pressure methods U.S. Pat. No. 4,151,686 discloses a high pressure, high temperature method, in which high pressure is used during the sintering step in order to stay in the diamond stable area of the phase diagram at 1300–1600° C., the sintering being performed in high-pressure chambers with pressures of 30.000–60.000 atm. Specially made presses and dies only achieve the required extremely high pressures. The consequences are high production costs, limited production capacity and limited shapes and sizes of the diamond composite bodies. The material produced according to the teachings of U.S. Pat. No. 4,181,686 contains at least 80 vol. % up to 95 vol. % of diamonds with a large amount of diamond-to-diamond bonds. The high content of diamond makes the material hard but also brittle and sensitive for mechanical shocks.

Another material produced with high-pressure high temperature methods is Syndax3 from De Beers. It is a material intended for abrasive wear, such as rock drilling. The material consists of diamond particles and SiC sintered together. According to The Industrial Diamond Review No 61985 Syndax3 material has diamond-diamond contact. One might think that a diamond-diamond contact would be good for the thermal conductivity properties Even so, Syndax3 exhibits, according to our measurements, a thermal diffusivity factor of not more than 1.442 $cm^2$/s and a thermal conductivity of not more than 265W/mK.

Several patents reveal techniques to produce materials containing diamond, silicon carbide and silicon without using high pressures. There are a number of variations of the process, mainly concerning the use of different carbonaceous materials (hereafter referring to all kinds of non-diamond carbon materials like carbon black, carbon fibers, coke, graphite, pyrolytic carbon etc). In principle the following steps are followed. A. Non-coated diamond particles or normally, carbon-coated diamond particles and carbonaceous materials are used as precursor materials. According to the examples, U.S. Pat. No. 4,220,455 starts with adding a thin layer (500–1000 Angstrom) of carbon on the diamonds by a pyrolytic reaction. The pyrolysis is done in vacuum for a few minutes by feeding natural gas or methane, into a furnace with diamond particles at 1200° C. Sometimes diamonds without a pyrolytic carbon layer are used, as in U.S. Pat. No. 4,381,271, EPO 0 043 541, EPO 0 056 596 and JP 6-199571A. Both carbon-coated and non-coated diamonds are mixed with carbonaceous materials as a main source of carbon, e.g. carbon black, short carbon fibers or cloth and a binder e.t.c, before the forming of green bodies. B. Forming of green bodies of the diamond particle/carbon material mixture is done in a mould. The green bodies contain additional solvents and temporary or permanent binders to facilitate the forming and to increase the strength of the green body. C. Work-pieces are made by heat-treating the green bodies. Some binders are vaporized without leaving any residues e.g. paraffin, other binders are hardened leaving a carbonaceous residue in the work-piece, e.g. phenol-formaldehyde and epoxy resins. D. Infiltration of the porous work-piece with molten silicon is done to form silicon carbide in a reaction between the carbon and the silicon. The heat treatment is done in such a manner as to minimize the graphitization of diamond, which is considered harmful. In the examples of U.S. Pat. No. 4,220,455 silicon is infiltrated in vacuum when the body is in a mould, at a temperature between 1400°–1550° C. for 15 minutes, during which time the reaction between silicon and carbon is completed. U.S. Pat. No. 4,242,106 uses a vacuum of 0,01–2,0 torr during the infiltration. The required time, depending largely on the size of the body is determined empirically and takes about 15–20 minutes at a temperature above 1400° C., or 10 minutes at 1500° C. U.S. Pat. No. 4,381,271 uses carbon fibers to promote the infiltration of liquid silicon by a capillary action. In most of the patents infiltration is made in a mould. In some earlier patents the infiltration is made outside the mould, like in EPO patent 0 043 541.

None of the methods to produce diamond-silicon carbide-silicon composites described above use graphitization intentionally.

In RU patent 2036779, a preform is moulded of diamond powder, possibly together with water or ethyl alcohol. The preform is placed in a furnace and impregnated with liquid silicon at 1420–1700° C. in argon or vacuum. In the process the surface of the diamond grains is minimally graphitized, such as the greater part of the diamond is still unchanged. This minor amount of graphite reacts in contact with infiltrated silicon, creating a thin surface of silicon carbide that keeps back any further formation of diamond to graphite during the used process. The drawback of this method is poor control and there is no method for governing the amount of produced SiC, residual silicon or residual porosity left in the composite.

In WO99/12866 and in WO000 18702, methods to produce a diamond-SiC—Si composite are disclosed. The composites produced consist of diamond particles in a matrix of SiC and Si or Si alloy in the following proportions: diamond particles at least 20 volume %, SiC at least 5 volume %. The composite has an excellent combination of properties such as low density, high elasticity modulus, low thermal expansion coefficient and it resists oxidation. However, the thermal conductivity of the material is not high enough to be able to solve the need of better heat sinks for the electronic industry.

The object of the present invention is to provide a material having at room temperature a thermal conductivity factor of at least 400 W/mK and a thermal diffusivity of at least 2.1 $cm^2$/s, which could be produced in a desired shape and in a cost-efficient way.

SUMMARY OF THE INVENTION

This object is according to the invention accomplished by a heat conductive composite material made from a mixture of diamond particles and comprising diamond particles, silicone carbide and silicon or silicon alloy, the silicon carbide forms an interconnected skeleton structure surrounding each individual diamond particle and silicon or silicon alloy fills the interstices of the silicon carbide skeleton, transformed diamond being the only carbon source in the material, wherein said conductive material has a diamond content of at least 58 vol % and 81 vol % at the most, a silicon carbide content of at least 3vol % and 39 vol % at the most and a content of silicon or silicon alloy of 41 vol % at the most, and the diamond particles consist of at least two fractions with different particle size, at least 50 w % of the particles in the mixture of diamond particles, from which the conductive material is made, having a diameter of 80 μm or above, whereby the conductive material has a thermal diffusivity of at least 2.1 $cm^2$/s and a thermal conductivity of at least 400 W/mK.

In a preferred embodiment, the nitrogen content in the diamond fraction with the largest diameter is 300 ppm or lower and the thermal conductivity is at least 430 W/mK.

In another preferred embodiment, the nitrogen content in the diamond fraction with the largest diameter is 130 ppm or lower and the thermal conductivity is at least 490 W/mK.

In a further preferred embodiment the nitrogen content in the diamond fraction with the largest diameter is 80 ppm or lower and the thermal conductivity is at least 550 W/mK.

In yet another preferred embodiment, the silicon alloy includes at least one metal from the group consisting of Ti, Zr, Hf, V, Nb, Ta, Cr, Mo, W, Mn, Re, Fe, Co, Ni, Cu, Ag, Al, Ge, and a small amount of a metal-carbon compound comprising at least one metal from the group consisting of Ti, Zr, Hf, V, Nb, Ta, Cr, Mo, W, Mn, Re, Fe, Co, Ni, Cu, Ag, Al, Ge can be included in the material. In this embodiment, the nitrogen content in the diamond fraction with the largest diameter is preferably 100 ppm or lower and the thermal conductivity is at least 500 W/mK.

BRIEF DESCRIPTION OF THE DRAWING

The invention will now be described with reference to the Figures, of which.

DESCRIPTION OF EMBODIMENTS

Figure 1:
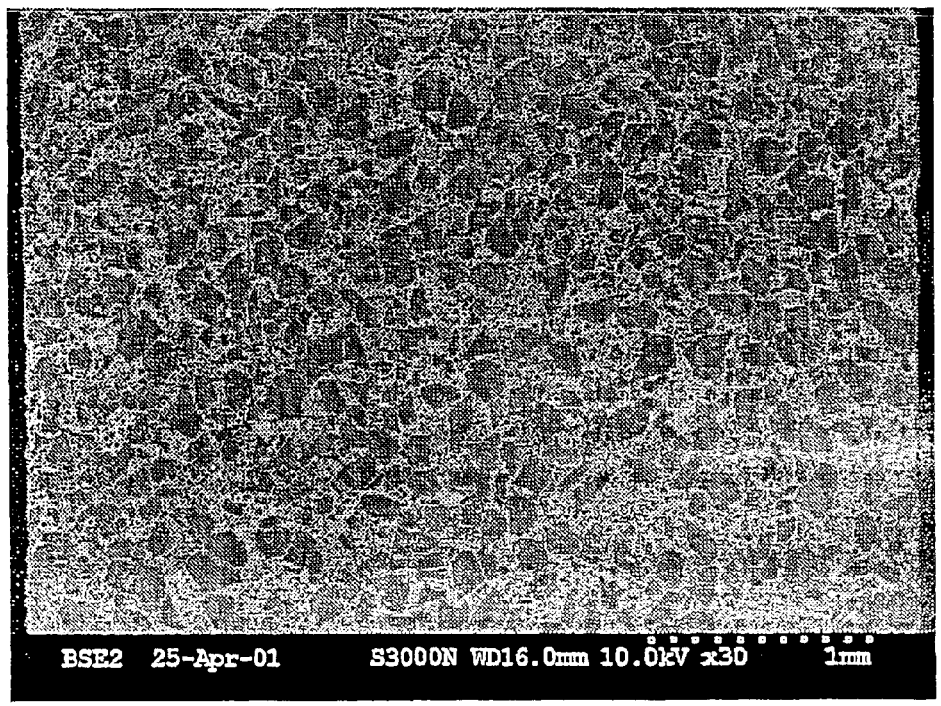
FIG. 1 shows a photo taken in a SEM of a cross section of a fractured material according to an embodiment of the invention.

The material according to the present invention is produced according to methods presented in WO99/12866 and WO0018702. These methods include the following steps:
1. Forming a porous workpiece out of a mixture, containing diamond particles.
2. Heat treating the work piece and controlling the heating temperature and heating time so that a certain desired amount of graphite is created by graphitization of diamond particles, thereby creating an intermediate body.
3. Infiltrating melted silicon or alternatively a silicon alloy into the intermediate body.
4. Reacting of the molten silicon and graphite to form SiC.

By the manufacturing process described above an article with a predetermined shape is formed. No shrinking, swelling or warpage occur on a macroscopic level during the process from the forming of the workpiece to the finished product. The above mentioned publications WO99/12866 and WOOO/18702 are referred to for further details of the methods and the contents thereof are incorporated herein.

In the following;
Green density=weight of green body/volume of green body,
Relative green density=green density/diamond theoretical density, and
Porosity=1−relative green density.

The workpiece is formed out of a mixture of diamond particles having a minimum size of 6 $\mu$m; the workpiece being formed with a relative green density of at least 60%. The diamond mixture consists of at least two different fractions with different diamond particle sizes. Of the diamond content in the workpiece at least 50 weighty/should have a diameter of 80 $\mu$m or above. The use of at least two different fractions with different diamond particle sizes is necessary in order to reach a packing degree in the work piece that in the sintered compact gives a high enough diamond concentration (i.e. a short path for the phonons to travel between the diamonds) to reach the required levels of thermal diffusivity and thermal conductivity. The content of diamond in the workpiece is at least 95% w, that is a small amount of binder can be used.

Forming of the workpiece is carried out by known methods such as pressing tape casting, slurry casting or gel casting using conventional equipment.

The total duration of the heat treatment of the diamond body is as long as is needed for the diamond mass in the body to have decreased by a desired amount due to graphitization of the diamond particles. An example of heat treatment is heating the workpiece to temperatures between 1000 and 1900° C. in vacuum or an inert atmosphere.

The infiltration of molten Si or silicon alloy is carried out by such known methods as melting a solid piece on the surface of the workpiece, feeding already molten Si or silicon alloy on to the surface of the workpiece or by dipping the workpiece into a melt of Si or silicon alloy. As the melt infiltrates the workpiece it reacts with graphite and form SiC or a SiC phase including elements from the alloying elements. The formed silicon carbide phase and a small amount of un-reacted silicon or silicon alloy phase fill up the porous space of the workpiece.

The heat treatment and infiltration can advantageously be carried out in the same furnace.

The infiltrating melt used can be a silicon alloy comprising at least one metal from the group consisting of Ti, Zr, Hf, V, Nb, Ta, Cr, Mo, W, Mn, Re, Fe, Co, Ni, Cu, Ag, At or Ge. In this case small amounts of secondary phase compounds may form, such as metal silicides, metal carbides, etc.

Figure 2:
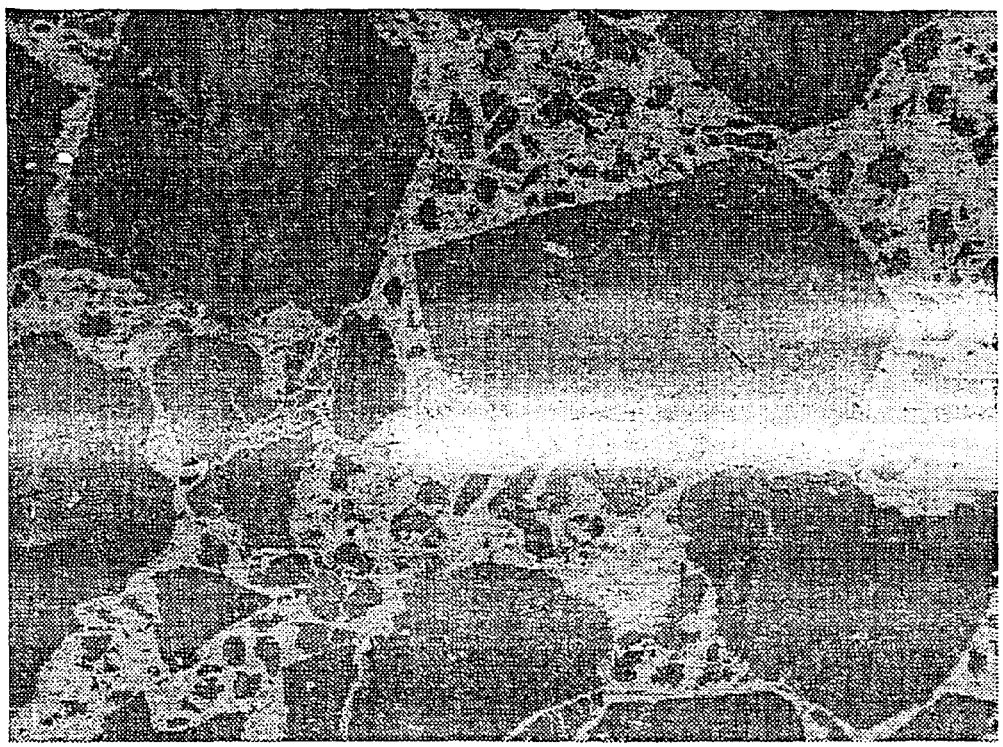
FIG. 2 shows a photo in larger scale taken in a SEM of a cross section of a fractured-material according to another embodiment of the invention.

The sintered composite material thus consists of three major phases, a diamond phase, a silicon carbide phase around the diamond particles and un-reacted silicon or silicon alloy phase between areas of silicon carbide. FIG. 1 shows an overview of a typical cross section of a material produced with the method described above in accordance with an embodiment of the present invention seen by back-scattered electron in scanning electron microscopy. Dark particles are diamond, gray skeleton is SiC and white spots are silicon areas. The initial composition was: 75 wt % D8 (150 $\mu$m)+20 wt % D31 (20 $\mu$m)+5 wt % D32 (7 $\mu$m), where the denotations D8, D31 and D32 are short names for different diamonds used and the different used mean particle sizes are indicated in the parenthesis. The silicon carbide that has formed from the reaction between the graphitized diamond and the melt is coating and surrounding each individual diamond particle. The SiC phase forms an interconnected skeleton structure, which is enclosing the diamond particles. FIG. 2 shows a more enlarged view of a typical cross section of a second embodiment of a material according to the invention containing 200–250 $\mu$m diamonds (diameters of the largest particles) to illustrate the close bond the diamonds and the SiC surrounding the diamonds. There is virtual no diamond-diamond contact in the composite material. Due to the fact that SiC has a thermal expansion coefficient larger than the thermal expansion coefficient of diamond, the SiC strives to contract more than the diamond particles during cooling after the termination of the heat treatment. At temperatures below the temperature at which the SiC was formed, the SiC surrounding the individual diamond particles will exert a compressive force on each particle. This is believed to contribute in some extent to the surprisingly good thermal conductivity of the material according to the invention. The silicon- or unreacted silicon alloy together with the possible small amounts of secondary phase compounds, such as metal carbides, metal silicides, etc, are located in the areas in-between the silicon carbide that enclose the diamond particles. The sintered composite material contains said phases in the following proportion: diamond 58–81 volume %, Si or Si alloy max 39 volume % and SiC 3–41 volume %

The limits of the diamond content have been determined empirically. A diamond concentration below 58 volume % in the finished body renders a too low thermal conductivity. A diamond concentration above 79 volume % is hard to achieve with the forming technique used. Moreover a diamond concentration above 79 volume % cause problems during the infiltration of the melt, the whole workpiece will not be completely filled by the melt, this leads to poor properties of the finished composite, both thermal and mechanical. However, with special forming techniques and moderate pressure-aided infiltration technique the diamond concentration in the finished body might be slightly increased, a diamond content of 81 volume % may be obtained.

To provide a high value of thermal conductivity to a composite material it is crucial to have good adhesion between the different phases, see Handbook of industrial diamonds and diamond films, page 184. The graphite layer formed on the surface of the diamond particles has a very good adhesion to the diamond since the graphite is transformed diamond. When silicon melt reacts with the said graphite the silicon carbide formed inherit the very good adhesion to the diamond and a strong bond between the carbide and diamond is formed. When nucleation of silicon carbide takes place on a graphite surface that has been formed trough graphitization of diamond the formed silicon carbide grows epitaxially, i.e. the growth of silicon carbide on the diamond follows the crystallographic orientation of the diamond The manner in which silicon carbide is formed and the strong bond between the diamond particles and the surrounding silicon carbide are believed to be decisive factors for obtaining the surprisingly high thermal conductivity of a material according to the present invention. A long free path for the phonon transport is obtained in the material according to the present invention. It is shown in table 3 that the thermal conductivity is dependent on how the carbon that form silicon carbide has been provided in materials with otherwise identical initial compositions.

A good quality of the raw materials, diamonds as well as silicon is essential in order to reach the maximum levels of thermal diffusivity and thermal conductivity. Examples of important diamond quality parameters are low cobalt, nickel and nitrogen bulk levels. It is well known that a low level of nitrogen gives good thermal conductivity. It is an advantage if the nitrogen content of the large sized diamond particles is 300 ppm or below, preferably 100 ppm and below. Very high thermal conductivity values are reached when the nitrogen content is 80 ppm and below.

The graphitization of the diamond surfaces has a positive effect with regards to physical surface defects on the diamond particles, caused by mechanical treatments like crushing or sieving. The graphitization transforms defective layers on the diamond surface, resulting in improvement of the phonon transport path.

Surprisingly we have found that a direct bonding between diamonds is not needed to achieve good thermal conductivity. To have a phonon transport path of high quality is more essential. It is being illustrated in the examples given below.

In table 1 and 2 thermal diffusivity and thermal conductivity values for a number of different phase compositions are shown. Table 1 stress the stated diamond levels, and table 2 the importance of diamond particle sizes. The denotations D1, D2 etc are short names for different diamonds used and mean particle size is indicated in the parenthesis.

The phase composition of the sintered samples given in table 1 and 2 are calculated values. The following four equations were used.

$$\phi_D = (1-\epsilon_0)(1-\alpha)$$

$$\phi_{SiC} = (1-\epsilon_0)(M_{SiC} * \rho_D / M_C * \rho_{SiC})\alpha$$

$$\phi_{Si} = 1(\phi_D + \phi_{SiC})$$

$$\alpha = (\rho_{ScD} + 1.18 * \epsilon_0 - 3.51)/(2.03(1-\epsilon_0))$$

Where $\epsilon_0$ is the starting porosity, $\rho_{ScD}$, $\rho_D$ and $\rho_{SiC}$ are the densities of sintered composite, diamond and silicon carbide, $M_{SiC}$ and $M_C$ are the molecular masses of silicon carbide and carbon and finally $\alpha$ is the graphitization degree.

TABLE 1

| Initial composition (wt %) | Particle size for each diamond type (μm) | Relative Green Density (%) | Density (g/cm3) | $C_P$ (J/kgK) calculated | Phase composition of the sintered composite (vol. fraction) D | SiC | Si | $\alpha \pm 5\%$ (cm²/s) measured | $\lambda$ (W/mK) calculated |
|---|---|---|---|---|---|---|---|---|---|
| 065% D1 + 25% D23 + 10% D32 | D1(420), D23(53), D32(7) | 77 | 3.293 | 538 | 0.79 | 0.03 | 0.18 | 3.455 | 612 |
| 65% D2 + 25% D23 + 10% D32 | D2(420), D23(53), D32(7) | 77 | 3.283 | 539 | 0.78 | 0.03 | 0.19 | 3.333 | 590 |
| 65% D34 + 25% D24 + 10% D32 | D34(300), D24(50), D32(7) | 79 | 3.332 | 544 | 0.75 | 0.13 | 0.12 | 3.408 | 618 |
| 65% D5 + 25% D31 + 10% D32 | D5(150), D31(20), D32(7) | 79 | 3.394 | 547 | 0.73 | 0.23 | 0.04 | 3.389 | 630 |
| 65% D11 + 35% D25 | D11(200), D25(28) | 75 | 3.230 | 549 | 0.72 | 0.06 | 0.23 | 2.642 | 468 |
| 75% D8 + 20% D31 + 5% D32 | D8(150), D31(20), D32(7) | 74 | 3.369 | 558 | 0.66 | 0.30 | 0.04 | 3.362 | 632 |
| 75% D9 + 15% D31 + 5% D32 | D9(88), D31(20), D32(7) | 72 | 3.306 | 559 | 0.65 | 0.24 | 0.11 | 2.642 | 488 |
| 75% D26 + 20% D31 + 5% D32 | D26(91), D31(20), D32(7) | 70 | 3.302 | 562 | 0.63 | 0.26 | 0.11 | 2.176 | 404 |
| 50.7% D3 + 49.3% D29 | D3(420), D29(10) | 71 | 3.345 | 563 | 0.62 | 0.32 | 0.06 | 2.713 | 511 |
| 70% D37 + 15% D24 + 5% D31 | D37(200), D24(50), 31(20) | 70 | 3.338 | 565 | 0.61 | 0.33 | 0.06 | 2.759 | 521 |
| 70% D24 + 30% D30 | D24(50), D30(5) | 70 | 3.340 | 566 | 0.60 | 0.34 | 0.06 | 2.036 | 385 |

TABLE 1-continued

| Initial composition (wt %) | Particle size for each diamond type (μm) | Relative Green Density (%) | Density (g/cm3) | $C_P$ (J/kgK) calculated | Phase composition of the sintered composite (vol. fraction) | | | $\alpha \pm 5\%$ (cm²/s) measured | $\lambda$ (W/mK) calculated |
|---|---|---|---|---|---|---|---|---|---|
| | | | | | D | SiC | Si | | |
| 70% D10 + 25% D31 + 5% D29 | D10(80), D31(20), D29(10) | 68 | 3.300 | 567 | 0.60 | 0.30 | 0.10 | 2.282 | 427 |
| 80% D7 + 15% D24 + 5% D31 | D7(125), D24(50), D31(20) | 65 | 3.227 | 569 | 0.58 | 0.24 | 0.18 | 2.704 | 497 |
| 100% D23 | D23(53) | 64 | 3.277 | 573 | 0.55 | 0.33 | 0.12 | 1.869 | 351 |
| 60% D24 + 40% D29 | D24(50), D29(10) | 65 | 3.295 | 578 | 0.55 | 0.36 | 0.09 | 1.762 | 336 |

TABLE 2

| Initial composition (wt %) | Particle size for each diamond type (μm) | Relative Green Density (%) | Density (g/cm3) | $C_P$ (J/kgK) calculated | Phase composition of the sintered composite (vol. fraction) | | | $\alpha \pm 5\%$ (cm²/s) measured | $\lambda$ (W/mK) calculated |
|---|---|---|---|---|---|---|---|---|---|
| | | | | | D | SiC | Si | | |
| 65% D4 + 25% D24 + 10% D32 | D4(500), D24(50), D32(7) | 79 | 3.345 | 545 | 0.75 | 0.15 | 0.10 | 3.590 | 657 |
| 65% D1 + 25% D28 + 10% D27 | D1(420), D28(53), D27(6) | 79 | 3.318 | 541 | 0.77 | 0.09 | 0.14 | 4.076 | 732 |
| 65% D3 + 25% D24 + 10% D32 | D3(420), D24(50), D32(7) | 79 | 3.339 | 544 | 0.75 | 0.14 | 0.11 | 3.372 | 613 |
| 50.7% D3 + 49.3% D29 | D3(420), D29(10) | 74 | 3.361 | 558 | 0.66 | 0.29 | 0.05 | 2.851 | 535 |
| 65% D34 + 25% D24 + 10% D32 | D34(300), D24(50), D32(7) | 79 | 3.332 | 544 | 0.75 | 0.13 | 0.12 | 3.408 | 618 |
| 65% D12 + 35% D31 | D12(160), D31(20) | 75 | 3.329 | 553 | 0.69 | 0.21 | 0.10 | 2.993 | 551 |
| 75% D8 + 20% D31 + 5% D32 | D8(150), D31(20), D32(7) | 74 | 3.369 | 558 | 0.66 | 0.30 | 0.04 | 3.362 | 632 |
| 65% D14 + 35% D31 | D14(180), D31(20) | 74 | 3.307 | 554 | 0.69 | 0.19 | 0.12 | 2.822 | 517 |
| 65% D13 + 25% D31 + 10% D32 | D13(160), D31(20), D32(7) | 77 | 3.364 | 551 | 0.71 | 0.23 | 0.06 | 2.793 | 517 |
| 70% D15 + 30% D35 | D15(150), D35(8) | 70 | 3.314 | 565 | 0.62 | 0.29 | 0.09 | 2.182 | 408 |
| 75% D36 + 20% D31 + 5% D32 | D36(125), D31(20), D32(7) | 74 | 3.332 | 557 | 0.68 | 0.24 | 0.08 | 2.562 | 475 |
| 75% D22 + 25% D29 | D22(125), D29(10) | 32 | 3.273 | 565 | 0.61 | 0.25 | 0.14 | 2.351 | 435 |
| 70% D17 + 30% D29 | D17(125), D29(10) | 69 | 3.311 | 566 | 0.61 | 0.30 | 0.09 | 2.230 | 418 |

TABLE 2-continued

| Initial composition (wt %) | Particle size for each diamond type (μm) | Relative Green Density (%) | Density (g/cm3) | $C_p$ (J/kgK) calculated | Phase composition of the sintered composite (vol. fraction) D | SiC | Si | α ± 5% (cm²/s) measured | λ (W/mK) calculated |
|---|---|---|---|---|---|---|---|---|---|
| 70% D16 + 30% D35 | D16(106), D35(8) | 70 | 3.322 | 565 | 0.62 | 0.30 | 0.08 | 2.226 | 418 |
| 75% D26 + 20% D31 + 5% D32 | D26(91), D31(20), D32(7) | 70 | 3.265 | 561 | 0.65 | 0.20 | 0.15 | 2.228 | 408 |
| 75% D9 + 15% D31 + 10% D32 | D9(88), D31(20), D32(7) | 72 | 3.306 | 559 | 0.65 | 0.24 | 0.11 | 2.642 | 488 |
| 70% D10 + 25% D31 + 5% D29 | D10(80), D31(20), D32(7) | 66 | 3.290 | 570 | 0.58 | 0.32 | 0.10 | 2.300 | 449 |
| 70% D18 + 30% D30 | D18(75), D30(5) | 71 | 3.315 | 562 | 0.64 | 0.27 | 0.09 | 2.020 | 376 |
| 70% D19 + 30% D30 | D19(63), D30(5) | 70 | 3.340 | 566 | 0.60 | 0.34 | 0.06 | 2.036 | 385 |
| 60% D24 + 40% D29 | D24(50), D29(10) | 65 | 3.295 | 578 | 0.55 | 0.36 | 0.09 | 1.762 | 336 |
| 70% D20 + 30% D33 | D20(45), D33(3) | 70 | 3.318 | 564 | 0.62 | 0.30 | 0.08 | 1.948 | 365 |
| 70% D21 + 30% D33 | D21(38), D33(3) | 70 | 3.328 | 564 | 0.62 | 0.30 | 0.08 | 1.946 | 365 |

The materials according to the invention exhibit a thermal expansion rate in the interval between $1.8*10^{-6}$ to $2.3*10^{-6}$ $K^{-1}$. It is a very low level of thermal expansion that corresponds well to the thermal expansion rates of integrated circuit boards.

As stated earlier creation of the carbon source for the carbide plays an important role in achieving a high level of thermal conductivity. A series of experiment were conducted in order to quantify this phenomenon. Carbon was added to the workpieces or formed in the workpiece in three different ways, then the workpieces were infiltrated with silicon melt and the thermal diffusivity of the sintered composite was measured. The diamond mixture forming the work piece was exactly the same, represented by sample composition A. The carbon sources supplied for the carbide formation were graphitization of the diamonds, pyrocarbon deposition in the workpiece and carbon powder mixed together with the diamond powder that forms the workpiece. The set up and results of the experiments are shown in table 3.

TABLE 3

| Manufacturing parameters | Sample number | Composition before graphitization (% wt) | Particle size (μm) | Measured α ± 5% (cm²/s) | Mean Value α (cm²/s) | Calculated Cp | Calculated λ (W/mK) |
|---|---|---|---|---|---|---|---|
| Graphitization, Si-infiltration | A1 A2 | A = 65% D8.25% D31, 10%D32, | D8(150), D31(20), D32(7) | 2.915 3.164 | 3.04 | 567 | 574 |
| PyroC deposition, Heat Treatment, Si-infiltration | B1 B2 | ~4% PyroC+ A | D8(150), D31(20), D32(7) | 2.080 2.108 | 2.09 | 566 | 394 |
| Carbon powder PyroC deposition, Heat Treatment, Si-infiltration | C1 C2 | 3% C, 4.5–5.3% PyroC, +A | D8(150), D31(20), D32(7) | 1.691 1.724 | 1.71 | 595 | 324 |
| Carbon powder, Heat Treatment, Si-infiltration | D1 D2 | 7% C +A | D8(150), D31(20), D32(7) | 2.043 1.883 | 1.96 | 594 | 378 |

It is clearly shown that sample A, where no external carbon source has been provided, has the highest thermal diffusivity. The phase compositions of the samples were in this case determined by SEM picture analysis of fractured surfaces to allow a calculated level of the conductivity.

There are some variations in the phase compositions between the four different groups of samples. The reason for these differences in the final product is the difficulties to reach the exact same final composition when using different manufacturing routes. When external carbon was added (B;C;D) the residual amount of silicon in the final sample was reduced from around 10% (A). This was especially the case when adding pyrocarbon (B;C), where less than 1% silicon was seen. Subsequently, the silicon carbide formation increased somewhat, but the overall phase shifts resulted in moderate differences in the $C_p$-values used to calculate the level of thermal conductivity of the different samples, cf. Table 3.

The above described variations are not large enough to explain the large difference in measured thermal diffusivity when external carbon is added. The importance of having carbon from diamond forming the surrounding SiC-layer that extends into the skeleton structure of the composite allows an optimal lattice mechanism of phonon transport. Table 3 shows the large influence of the origin of the carbon source on the thermal diffusivity. When the composite is made according to the present invention, the final level of thermal conductivity exceeds that of metals, one of the best being copper with $\lambda=400$ W/mK and $\alpha=1,16$ cm$^2$/s.

Thermal diffusivity was measured using laser flash technique. The top surface of the sample disc was irradiated with a laser, which provided an instantaneous energy pulse. The laser energy was absorbed by the top surface and traveled through the sample. Immediately after the laser flash has been emitted, the temperature of the rear face was monitored for heat radiation, which was detected using a photovoltaic infrared detector. The laser pulse raised the temperature of the sample with only a few degrees. The thermal diffusivity ($\alpha$) was calculated from the thickness (L) of the sample and the time required for the temperature of the rear surface to reach half of the total temperature rise ($t_{1/2}$) using the equation $\alpha=kL^2/t_{1/2}$ where k is a constant. The laser flash equipment used was a ULVAC Sinkt-Rilco TC-700/Melt with Neodymium glass laser that has oscillating wavelength 1.064 μm and an Indium antimony IRL detector that was cooled with a liquid nitrogen. The dimensions of the samples were discs with 10 mm diameter and a thickness of 4–5 mm. The measurements were done at room temperature, the pulse width 0.88 ms, pulse duration 0.3 ms, pulse diameter 15 mm, pulse energy 15 J/pulse and voltage 2.4 kV.

The thermal conductivity $\lambda$ was then calculated using the equation $\alpha=\lambda/C_p\rho$, where $C_p$ is the thermal capacity and $\rho$ the density. The thermal capacity $C_p$ was calculated according to $C_p=\Sigma(\rho_i\phi_iC_i)/\rho_{ScD}$ where $\rho_{ScD}$ is the density of the sintered composite, $\rho_i$ the density of each phase, $\phi_i$ is the volume part of each phase and $C_i$ is the thermal capacity of each phase.

What is claimed is:

1. A heat conductive composite material made from a mixture of diamond particles and comprising diamond particles, silicone carbide and silicon or silicon alloy, the silicon carbide forms an interconnected skeleton structure surrounding each individual diamond particle and silicon or silicon alloy fills the interstices of the silicon carbide skeleton, transformed diamond being the only carbon source in the material, wherein said conductive material has a diamond content of at least 58 vol % and 81 vol % at the most, a silicon carbide content of at least 3 vol % and 39 vol % at the most and a content of silicon or silicon alloy of 41 vol % at the most, and the diamond particles consist of at least two fractions with different particle size, at least 50 wt % of the particles in the mixture of diamond particles, from which the conductive material is made, having a diameter of 80 μm or above, whereby the conductive material has a thermal diffusivity of at least 2.1 cm$^2$/s and a thermal conductivity of at least 400 W/mK.

2. A heat conductive material according to claim 1, wherein the nitrogen content in the diamond fraction with the largest diameter is 300 ppm or lower and the thermal conductivity is at least 430 W/mK.

3. A heat conductive material according to claim 2, wherein the nitrogen content in the diamond fraction with the largest diameter is 130 ppm or lower and the thermal conductivity is at least 490 W/mK.

4. A heat conductive material according to claim 3, wherein the nitrogen content in the diamond fraction with the largest diameter is 80 ppm or lower and the thermal conductivity is at least 550 W/mK.

5. A heat conductive material according to claim 1, wherein the silicon alloy includes at least one metal from the group consisting of Ti, Zr, Hf, V, Nb, Ta, Cr, Mo, W, Mn, Re, Fe, Co, Ni, Cu, Ag, Al, Ge.

6. A heat conductive material according to claim 5, wherein a small amount of a metal-carbon compound comprising at least one metal from the group consisting of Ti, Zr, Hf, V, Nb, Ta, Cr, Mo, W, Mn, Re, Fe, Co, Ni, Cu, Ag, Al, Ge is included in the material.

7. A heat conductive material according to claim 5, wherein the nitrogen content in the diamond fraction with the largest diameter is 100 ppm or lower and the thermal conductivity is at least 500 W/mK.

* * * * *